(12) United States Patent
Wang et al.

(10) Patent No.: US 11,257,935 B2
(45) Date of Patent: Feb. 22, 2022

(54) GAN RECTIFIER SUITABLE FOR OPERATING UNDER 35GHZ ALTERNATING-CURRENT FREQUENCY, AND PREPARATION METHOD THEREFOR

(71) Applicant: SOUTH CHINA UNIVERSITY OF TECHNOLOGY, Guangzhou (CN)

(72) Inventors: Wenliang Wang, Guangzhou (CN); Guoqiang Li, Guangzhou (CN); Xiaochan Li, Guangzhou (CN); Yuan Li, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 84 days.

(21) Appl. No.: 16/769,157

(22) PCT Filed: Jan. 31, 2018

(86) PCT No.: PCT/CN2018/074684
§ 371 (c)(1),
(2) Date: Jun. 2, 2020

(87) PCT Pub. No.: WO2019/114116
PCT Pub. Date: Jun. 20, 2019

(65) Prior Publication Data
US 2021/0217879 A1    Jul. 15, 2021

(30) Foreign Application Priority Data
Dec. 15, 2017 (CN) .......................... 201711351659.1

(51) Int. Cl.
*H01L 29/15* (2006.01)
*H01L 29/66* (2006.01)
(Continued)

(52) U.S. Cl.
CPC .... *H01L 29/66856* (2013.01); *H01L 21/0254* (2013.01); *H01L 21/02381* (2013.01);
(Continued)

(58) Field of Classification Search
CPC ......... H01L 21/02381; H01L 21/02433; H01L 21/0254; H01L 21/02609; H01L 21/3065; H01L 29/2003; H01L 29/66856
See application file for complete search history.

(56) References Cited

U.S. PATENT DOCUMENTS 10,224,401 B2 * 3/2019 Mishra ................ H01L 29/4236
2007/0096239 A1   5/2007 Cao et al.
(Continued)

FOREIGN PATENT DOCUMENTS

CN    101908511    12/2010
CN    010562182    8/2012
(Continued)

*Primary Examiner* — Jay C Kim
(74) *Attorney, Agent, or Firm* — Loza & Loza, LLP; Michael F. Fedrick

(57) ABSTRACT

The present invention discloses a method for preparing a GaN rectifier suitable for operating at an alternating current frequency of 35 GHz: sequentially growing, on a silicon substrate, an N-polar GaN buffer layer, a carbon doped semi-insulated N-polar GaN layer, a non-doped N-polar AlGaN layer, a non-doped N-polar GaN layer and a non-doped N-polar InGaN thin film to obtain a rectifier epitaxial wafer; preparing a pattern groove for a schottky contact electrode on the GaN rectifier epitaxial wafer, and depositing the schottky contact electrode in the groove; preparing a pattern for an ohmic contact electrode, and depositing a device ohmic contact electrode on the surface of the epitaxial wafer; subsequently, depositing a silicon nitride passivation layer at a part where there is no electrode on the surface of the epitaxial wafer, and preparing a surface electrode area; and finally, performing mesa isolation treat- (Continued)

ment on the GaN rectifier epitaxial wafer. The present invention realizes the preparation of a high-frequency GaN rectifier, and improves the performance stability of a rectifier device operating at a high power.

10 Claims, 2 Drawing Sheets

(51) Int. Cl.
- *H01L 21/02* (2006.01)
- *H01L 21/3065* (2006.01)
- *H01L 29/20* (2006.01)
- *H01L 29/812* (2006.01)

(52) U.S. Cl.
CPC .. *H01L 21/02433* (2013.01); *H01L 21/02609* (2013.01); *H01L 21/3065* (2013.01); *H01L 29/2003* (2013.01); *H01L 29/812* (2013.01)

(56) References Cited

U.S. PATENT DOCUMENTS

| | | | |
|---|---|---|---|
| 2013/0200428 A1 | 8/2013 | Rountree |
| 2015/0021659 A1 | 1/2015 | Rountree |

FOREIGN PATENT DOCUMENTS

| | | |
|---|---|---|
| CN | 104428988 | 3/2015 |
| CN | 106449916 | 2/2017 |

\* cited by examiner

GAN RECTIFIER SUITABLE FOR OPERATING UNDER 35GHZ ALTERNATING-CURRENT FREQUENCY, AND PREPARATION METHOD THEREFOR

CROSS-REFERENCE TO RELATED APPLICATIONS

This application is the U.S. national stage of International Patent Application No. PCT/CN2018/074684, filed on Jan. 31, 2018 and entitled GAN RECTIFIER SUITABLE FOR OPERATING UNDER 35 GHZ ALTERNATING-CURRENT FREQUENCY, AND PREPARATION METHOD THEREFOR, which claims the benefit of priority under 35 U.S.C. § 119 from Chinese Patent Application No. 201711351659.1, filed Dec. 15, 2017. The disclosures of the foregoing applications are incorporated herein by reference in their entirety.

TECHNICAL FIELD

The present invention relates to a rectifier, particularly a GaN rectifier suitable for operating at an alternating current frequency of 35 GHz, and to a preparation method therefor.

BACKGROUND ART

A rectifier that is used as a power electronic component which plays an important role in the fields of national defense, energy transmission, etc. is of a concern to various industries. Traditional Si-based rectifier thyristors, because of narrow band gap, low electronic saturated migration rate, low thermal conductivity or the like of their materials, cause large device volume, large reverse leakage current, serious heating under high and medium-frequency operations and other performance stability problems. It is thus difficult to meet the increasing requirements for device miniaturization, integration and high frequency. Therefore, there is a need to develop a new generation of rectifier devices that can be applied in the high-frequency areas while meeting the application requirements for device miniaturization and integration. Studies on group III nitride rectifiers, such as GaN as a representative have emerged. The third generation of semiconductor materials, such as GaN as a representative, compared to traditional Si-based materials, has excellent properties, such as wider band gap width, higher critical breakdown electric field, higher limiting operation temperature and saturated electron mobility, which means that compared to the Si-based rectifier thyristor, a GaN rectifier device is more suitable to be applied in the high-voltage and high-frequency workplace, more excellent properties of thermal conductivity give the GaN rectifier more broad application prospects and performance stability in the miniaturized and integrated application areas. Therefore, it has revolutionary significance and social application value to explore the implementation method for a GaN rectifier operating at a high alternating current frequency of 35 GHz.

SUMMARY OF THE INVENTION

In order to overcome the disadvantages and shortcomings of the prior art, it is an objective of the present invention to provide a method for preparing a GaN rectifier suitable for operating at an alternating current frequency of 35 GHz. The method has the advantages of a high degree of matching with the existing production means in preparation and being easy to implement.

The objective of the present invention is realized by the following technical solutions:

a method for preparing a GaN rectifier suitable for operating at an alternating current frequency of 35 GHz, which includes the following steps:

(1) sequentially growing, on a silicon substrate, an N-polar GaN buffer layer, a carbon doped semi-insulated N-polar GaN layer, a non-doped N-polar AlGaN layer, a non-doped N-polar GaN layer and a non-doped N-polar InGaN thin film to obtain a rectifier epitaxial wafer;

(2) placing the GaN rectifier epitaxial wafer obtained in step (1) sequentially into acetone, deionized water and anhydrous ethanol for ultrasonic treatment, and cleaning the epitaxial wafer with deionized water and then drying the epitaxial wafer by hot and high purity nitrogen;

(3) performing lithographic preparation of a schottky contact electrode pattern on the GaN rectifier epitaxial wafer obtained in step (2) by: spin-coating the GaN rectifier epitaxial wafer obtained in step (2) uniformly with photoresist, pre-baking and then exposing the GaN rectifier epitaxial wafer coated with photoresist in a lithography machine, and finally immersing the exposed epitaxial wafer in a developing liquid for lithographic development and cleaning;

(4) performing reactive ion etching on the GaN rectifier epitaxial wafer after same is subjected to the lithography process, and etching grooves along the schottky contact electrode patterns in the GaN rectifier epitaxial wafer to obtain an ohmic contact electrode;

(5) placing the GaN rectifier epitaxial wafer etched on the grooves corresponding to patterns of the ohmic contact electrode and obtained in step (4) into an electron beam evaporation device and evacuating an evaporation chamber, followed by successively evaporating with schottky contact electrode metals, and after the evaporation, annealing the GaN rectifier epitaxial wafer;

(6) removing photoresist by immersing the GaN rectifier epitaxial wafer into a degumming liquid, rinsing the epitaxial wafer with deionized water and performing ultrasonic treatment by using acetone to remove photoresist and evaporated metals residual on the surface of the GaN rectifier epitaxial wafer, and after ultrasonic treatment, cleaning same with the deionized water and drying same with hot and high purity nitrogen;

(7) aligning the GaN rectifier epitaxial wafer with an alignment mark in a mask, repeating the process in step (3) to perform lithographic development at corresponding positions, and preparing device ohmic contact electrode patterns and cleaning same;

(8) conducting ohmic contact electrode preparation on the GaN rectifier epitaxial wafer by: placing the GaN rectifier epitaxial wafer with the developed ohmic contact electrode patterns obtained in step (7) into the electron beam evaporation device and evacuating an evaporation chamber, followed by successively evaporating with the ohmic contact electrode metals, and after the evaporation, annealing the GaN rectifier epitaxial wafer;

(9) repeating the process in the step (6) to remove the photoresist and evaporation metal residual on the surface of the GaN epitaxial wafer by means of immersion in the degumming liquid and ultrasonic cleaning;

(10) preparing a silicon nitride passivation layer using a plasma enhanced chemical vapor deposition method by: placing the GaN rectifier epitaxial wafer obtained in step (9) into a plasma enhanced chemical vapor deposition device, warming up and evacuating to a high vacuum, and then introducing a carrier gas and a reactive gas into the device, and then depositing an SiN$_x$ passivation layer on the surface of the GaN rectifier epitaxial wafer, where x=1.33-1.5;

(11) repeating the process in step (3), preparing a mask on the surface of the GaN epitaxial wafer by means of lithographic development, and exposing the SiNx on the patterns of the ohmic contact electrode and the schottky contact electrode;

(12) etching away the exposed SiNx by using a wet etching method, and finally repeating the process in step (6) to remove the photoresist residual on the surface of the GaN rectifier epitaxial wafer and the silicon nitride passivation layer and clean the epitaxial wafer by means of immersion in the degumming liquid and ultrasonic cleaning;

(13) performing alignment by means of the alignment mark in the mask, and repeating the process in step (3) to prepare mesa isolation patterns on the surface of the GaN epitaxial wafer by means of lithographic development;

(14) mesa isolation: repeating the process in step (4) to etch grooves on the surface of the GaN rectifier epitaxial wafer obtained in step (13) by using a reactive ion etching device and clean up the epitaxial wafer;

(15) fabricating a mesa isolation passivation layer by: placing the GaN rectifier epitaxial wafer obtained in step (14) into a plasma-assisted chemical vapor deposition device, and repeating the process in step (10) to deposit an SiNx passivation layer inside the etched grooves of the GaN rectifier epitaxial wafer; and

(16) after removing the excessive SiNx layer on the surface of the GaN rectifier epitaxial wafer processed in step (15) by using the wet etching process in step (12), removing the residual SiNx and photoresist on the surface of the GaN rectifier epitaxial wafer by means of immersion in the degumming liquid and ultrasonic cleaning by using the process in step (6), so as to finally obtain a GaN rectifier chip, suitable for operating at an alternating current frequency of 35 GHz, on the silicon substrate.

The silicon substrate in step (1) has a (111) close-packed plane as an epitaxial plane; and all of the N-polar GaN buffer layer, the carbon doped semi-insulated N-polar GaN layer, the non-doped N-polar AlGaN layer, the non-doped N-polar GaN layer and the non-doped N-polar InGaN thin film take (0001) as an epitaxial direction.

The times for the ultrasonic treatment in steps (2) and (6) are both 3-15 mins.

The photoresist in step (3) is 0.2-0.7 nm in thickness; the time for exposure is 1-4 s; and the time for development is 45-95 s.

The groove in step (4) is 150-400 nm in depth.

Vacuum degrees of the vacuum in steps (5) and (8) are both $1$-$5\times10^{-5}$ Pa; and the temperatures for annealing in steps (5) and (8) are both 450-800° C., and the times for annealing are both 30-120 min.

The time for immersion in step (6) is 45-100 min.

The times for deposition of the SiNx passivation layer in steps (10) and (15) are both 60-120 min.

The groove in step (14) is 1-2.5 μm in depth.

Provided is a GaN rectifier suitable for operating at an alternating current frequency of 35 GHz, which is prepared and obtained by the method for preparing a GaN rectifier suitable for operating at an alternating current frequency of 35 GHz.

Compared with the prior art, the present invention has the advantages and beneficial effects as follow.

(1) The present invention makes it possible to prepare a high-frequency (35 GHz) GaN rectifier, in which a T-shaped gate design is adopted in the schottky contact electrode structure design part, and can effectively improve the rectifier device gate-controlled properties and effectively reduce the current concentration effect of the rectifier device during operation, improve the performance stability of the rectifier device under high power operation.

(2) According to the present invention, group III nitride, such as GaN as a representative, is used as the basic material of the rectifier. Compared with traditional Si material, relying on the better material characteristics of group III nitride, the present invention can better realize miniaturization and integration of the device in higher frequency applications.

(3) According to the present invention, n-polar group III nitride is used as the substrate material of the device, and compared with the traditional metal polarity surface group III nitride, the present invention can effectively enhance the two-dimensional electronic gas confinement at the interface of AlGaN/GaN heterojunction and enhance the gate-controlled properties of the device, thereby making it easy to produce enhanced rectifier devices suitable for operating at an alternating current frequency of 35 GHz.

(4) According to the present invention, Si material most commonly used in the integrated circuit is selected as an epitaxial substrate of the device to facilitate implementing the integrated application of the device.

DETAILED DESCRIPTION OF EMBODIMENTS

The present invention will be further described in detail in conjunction with embodiments below, but the implementations of the present invention are not limited thereto.

Embodiment 1

A method for preparing a GaN rectifier chip suitable for operating at an alternating current frequency of 35 GHz on a silicon substrate of this embodiment is as follows.

Figure 1:
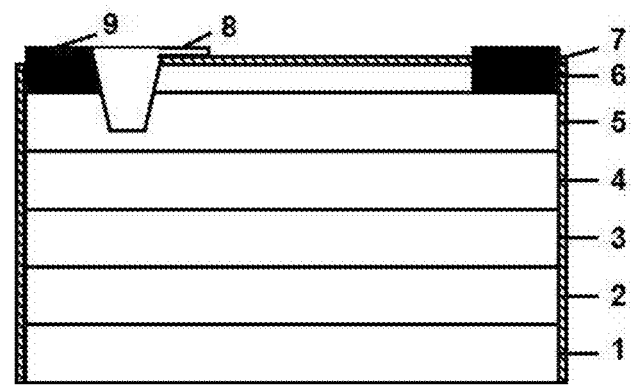
FIG. 1 is a schematic sectional view of a GaN rectifier chip prepared according to embodiment 1 of the present invention.

(1) As shown in FIG. 1, by using metal organic chemical vapor deposition technique, a GaN rectifier epitaxial wafer is grown on a silicon substrate, including an N-polar GaN buffer layer 2 grown on the silicon substrate 1, a carbon doped semi-insulated N-polar GaN layer 3 grown on the N-polar GaN buffer layer 2 with the doping concentration of $5.9\times10^{18}$ cm$^{-3}$, a non-doped N-polar AlGaN layer 4 grown on the carbon doped semi-insulated N-polar GaN layer 3, a non-doped N-polar GaN layer 5 grown on the non-doped N-polar AlGaN layer 4, a non-doped N-polar InGaN thin film 6 grown on the non-doped N-polar GaN layer 5, wherein the GaN buffer layer is 800 nm in thickness; the carbon doped GaN layer 4 is 100 nm in thickness; the non-doped AlGaN layer is 450 nm in thickness; the non-doped GaN layer is 500 nm in thickness; and the non-doped InGaN layer is 150 nm in thickness.

(2) The GaN rectifier epitaxial wafer is sequentially placed into acetone, anhydrous ethanol and deionized water for ultrasonic treatment for 3 min respectively, the epitaxial wafer is rinsed with deionized water, and then the cleaned GaN rectifier epitaxial wafer is dried by hot and high purity nitrogen.

(3) The cleaned GaN epitaxial wafer is spin-coated with positive photoresist, with the model of RZJ304 and the photoresist thickness of 0.3 μm; the epitaxial wafer coated with photoresist is placed into a hot stage to be pre-baked for 45 s; then, the epitaxial wafer coated with photoresist is placed into a lithography machine for lithographic exposure, with exposure time of 3 s; next, the exposed epitaxial wafer is immersed into a positive developing liquid, with the model of the developing liquid of RZX3038, the immersion time of 60 s; and finally, the epitaxial wafer after completed development is taken out and then washed with deionized water and dried with high purity nitrogen, and the epitaxial wafer is placed on the hot stage to be baked for film hardening, with the baking time of 45 s.

(4) The GaN rectifier epitaxial wafer after lithography is placed into the reactive ion etching machine to perform reactive ion etching on the patterns of the schottky contact electrode 8 exposed by the lithography, so as to etch out grooves corresponding to the patterns, with the depth of the grooves being 200 nm.

(5) Preparation of a schottky contact electrode 8 is performed on the GaN rectifier epitaxial wafer by: placing the GaN rectifier epitaxial wafer etched by reactive ions into an electron beam evaporation device, in which the chamber is evacuated to $1\times10^{-5}$ Pa, followed by successively evaporating with electrode metals $MoS_2$/Ni/Au, and after the evaporation, the GaN rectifier epitaxial wafer is annealed at the temperature of 500° C. for 60 min.

(6) The GaN rectifier epitaxial wafer prepared with ohm electrodes is immersed into the degumming liquid for 60 min, the epitaxial wafer is rinsed with deionized water after taken out and then placed into acetone to be subjected to ultrasonic treatment for 5 min, and after taken out, the epitaxial wafer is rinsed with deionized water and dried with hot nitrogen.

(7) The GaN rectifier epitaxial wafer is aligned with an alignment mark in the mask, the lithography process in the step (3) is repeated to perform the lithographic development at corresponding positions so as to prepare the area of device schottky contact electrode patterns exposed on the GaN rectifier epitaxial wafer.

(8) Preparation of an ohmic contact electrode 9 is conducted on the GaN rectifier epitaxial wafer after lithography by: placing the GaN rectifier epitaxial wafer prepared with the device's ohmic contact patterns into the electron beam evaporation device, in which the chamber is evacuated to $1\times10^{-5}$ Pa, followed by successively evaporating with the ohmic contact electrode materials Ti/Al/Ni/Au.

(9) The process in step (6) is repeated to remove the photoresist and evaporated metals residual on the surface of the GaN epitaxial wafer by means of immersion in the degumming liquid and ultrasonic cleaning.

(10) An $SiN_x$ passivation layer 7 is prepared using a plasma-enhanced chemical vapor deposition method by: placing the GaN rectifier epitaxial wafer that is prepared with electrodes into the plasma enhanced chemical vapor deposition device, in which the instrument is warmed up to 800° C., the chamber is evacuated to $1\times10^{-5}$ Pa, and the deposition time is 60 min.

(11) The process in step (3) is repeated to prepare the mask on the surface of the GaN epitaxial wafer by means of lithographic development, and expose the $SiN_x$ (x=1.33-1.5) on the patterns of the ohmic contact electrode and schottky contact electrode.

(12) The exposed $SiN_x$ passivation layer is etched away by using a wet etching method; after taken out, the epitaxial wafer is rinsed with deionized water; and finally, the process in step (6) is repeated to remove the photoresist and $SiN_x$ residual on the surface of the epitaxial wafer by means of immersion in degumming liquid and ultrasonic cleaning.

(13) Alignment is performed by means of the alignment mark in the mask, and the process in step (3) is repeated to prepare mesa isolation patterns on the surface of the GaN epitaxial wafer by means of lithographic development.

(14) The mesa isolation patterns are etched by: repeating the process in step (4) to etch the grooves on the surface of the GaN rectifier epitaxial wafer obtained in step (13) by using the reactive ion etching device, in which the etching depth is 2 μm; and after etching, cleaning the surface of epitaxial wafer with deionized water and drying same with hot nitrogen.

(15) A mesa isolation passivation layer is fabricated by: placing the GaN rectifier epitaxial wafer into the plasma-assisted chemical vapor deposition device, and repeating the process in step (10) to deposit the $SiN_x$ passivation layer in the etched grooves of the GaN rectifier epitaxial wafer for 60 min.

(16) After the excess $SiN_x$ layer is removed from the surface using the wet etching process in step (12), the $SiN_x$ and photoresist residual on the surface of the GaN rectifier epitaxial wafer is removed by means of immersion in degumming liquid and ultrasonic cleaning of the process in step (6), so as to finally obtain a GaN rectifier chip, suitable for operating at an alternating current frequency of 35 GHz, on the silicon substrate.

Figure 2:
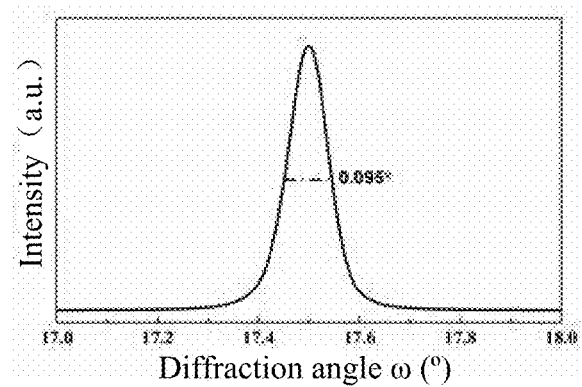
FIG. 2 is an X-ray rocking curve diagram of GaN (0002) of embodiment 1 of the present invention.
Figure 3:
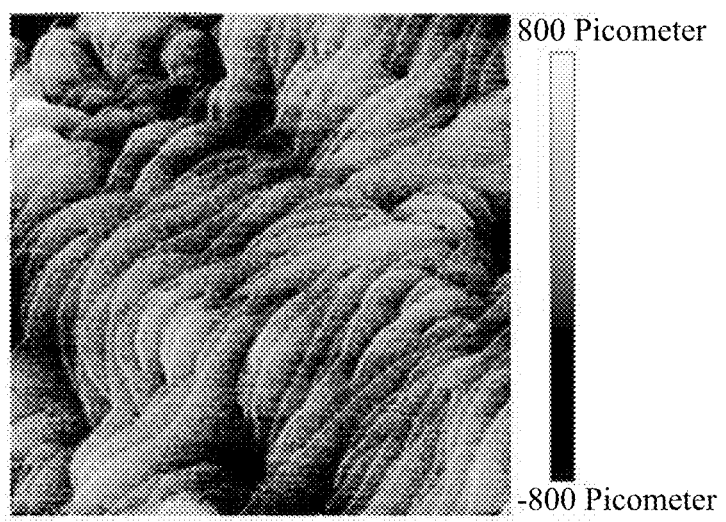
FIG. 3 is an illustration of an atomic force microscopy topography of the surface of a GaN epitaxial wafer of embodiment 1 of the present invention.

The GaN rectifier structure fabricated according to this embodiment is shown in FIG. 1; and the GaN (0002) X-ray rocking curve of the GaN thin film is shown in FIG. 2, with the full width at half maximum value of 0.0096°. The atomic force microscope of the surface topography of the GaN epitaxial wafer is shown in FIG. 3. The surface topography presents a smooth and ideal laminar flow structure, with the surface roughness of RMS≤0.9 angstrom, and the surface topography and crystal quality are very good.

Embodiment 2

A method for preparing a GaN rectifier chip suitable for operating at an alternating current frequency of 35 GHz on a silicon substrate of this embodiment is as follows.

(1) By using metal organic chemical vapor deposition technique, a GaN rectifier epitaxial wafer is grown on a silicon substrate, including an N-polar GaN buffer layer grown on the silicon substrate, a carbon doped semi-insulated N-polar GaN layer grown on the N-polar GaN buffer layer with the doping concentration of $5.9\times10^{18}$ $cm^{-3}$, a non-doped N-polar AlGaN layer grown on the carbon doped semi-insulated N-polar GaN layer, a non-doped N-polar GaN layer grown on the non-doped N-polar AlGaN layer, a non-doped N-polar InGaN thin film grown on the non-doped N-polar GaN layer, wherein the GaN buffer layer is 600 nm in thickness; the carbon doped GaN layer is 150 nm in thickness. the non-doped AlGaN layer is 300 nm in thickness; the non-doped GaN layer is 400 nm in thickness; and the non-doped InGaN layer is 70 nm in thickness.

(2) The GaN rectifier epitaxial wafer is sequentially placed into acetone, anhydrous ethanol and deionized water for ultrasonic treatment for 3 min respectively, the epitaxial wafer is rinsed with deionized water, and then the cleaned GaN rectifier epitaxial wafer is dried by hot and high purity nitrogen.

(3) The cleaned GaN epitaxial wafer is spin-coated with positive photoresist, with the model of RZJ304 and the photoresist thickness of 0.2 μm; the epitaxial wafer coated with photoresist is placed into a hot stage to be pre-baked for 45 s; then, the epitaxial wafer coated with photoresist is placed into a lithography machine for lithographic exposure, with exposure time of 1 s; next, the exposed epitaxial wafer is immersed into a positive developing liquid, with the model of the developing liquid of RZX3038, the immersion time of 30 s; and finally, the epitaxial wafer after completed development is taken out and then washed with deionized water and dried with high purity nitrogen, and the epitaxial wafer is placed on the hot stage to be baked for film hardening, with the baking time of 45 s.

(4) The GaN rectifier epitaxial wafer after lithography is placed into the reactive ion etching machine, so as to perform reactive ion etching on the patterns of the schottky contact electrode exposed by the lithography, so as to etch out grooves corresponding to the patterns, with the depth of the grooves being 200 nm.

(5) Preparation of a schottky contact electrode is performed on the GaN rectifier epitaxial wafer by: placing the GaN rectifier epitaxial wafer etched by reactive ions into an electron beam evaporation device, in which the chamber is evacuated to $3\times10^{-5}$ Pa, followed by successively evaporating with electrode metals $MoS_2$/Ni/Au, and after the evaporation, the GaN rectifier epitaxial wafer is annealed at the temperature of 800° C. for 120 min.

(6) The GaN rectifier epitaxial wafer that is prepared with the ohm electrodes is immersed into the degumming liquid for 45 min, the epitaxial wafer is rinsed with deionized water after taken out and then placed into acetone to be subjected to ultrasonic treatment for 5 min, and after taken out, the epitaxial wafer is rinsed with deionized water and dried with hot nitrogen.

(7) The GaN rectifier epitaxial wafer is aligned with an alignment mark in the mask, the lithography process in the step (3) is repeated to perform the lithographic development at corresponding positions so as to prepare the area of device schottky contact electrode patterns exposed on the GaN rectifier epitaxial wafer.

(8) Preparation of an ohmic contact electrode is conducted on the GaN rectifier epitaxial wafer after lithography by: placing the GaN rectifier epitaxial wafer that is prepared with the ohmic contact electrode into the electron beam evaporation device, in which the chamber is evacuated to $1\times10^{-5}$ Pa, followed by successively evaporation with the ohmic contact electrode materials Ti/Al/Ni/Au, and after the evaporation, the GaN rectifier epitaxial wafer is annealed at temperature of 800° C. for 120 min.

(9) The process in step (6) is repeated to remove the photoresist and evaporated metals residual on the surface of the GaN epitaxial wafer by means of immersion in the degumming liquid and ultrasonic cleaning.

(10) An $SiN_x$ passivation layer is prepared using a plasma-enhanced chemical vapor deposition method by: placing the GaN rectifier epitaxial wafer that is prepared with electrodes into the plasma enhanced chemical vapor deposition device, in which the instrument is warmed up to 800° C., the chamber is evacuated to $5\times10^{-5}$ Pa, and the deposition time is 60 min.

(11) The process in step (3) is repeated to prepare a mask on the surface of the GaN epitaxial wafer by means of lithographic development, and to expose the $SiN_x$ (x=1.33-1.5) on the patterns of the ohmic contact electrode and the schottky contact electrode.

(12) The exposed $SiN_x$ passivation layer is etched away by using a wet etching method; after taken out, the epitaxial wafer is rinsed with deionized water; and finally, the process in step (6) is repeated to remove the photoresist and $SiN_x$ (x=1.33-1.5) residual on the surface of the epitaxial wafer by means of immersion in the degumming liquid and ultrasonic cleaning.

(13) Alignment is performed by means of the alignment mark in the mask, and the process in step (3) is repeated to prepare mesa isolation patterns on the surface of the GaN epitaxial wafer by means of lithographic development.

(14) The mesa isolation patterns are etched by: repeating the process in step (4) to etch the grooves on the surface of the GaN rectifier epitaxial wafer obtained in step (13) by using the reactive ion etching device, in which the etching depth is 1 μm; and after etching, cleaning the surface of epitaxial wafer with deionized water and drying same with hot nitrogen.

(15) A mesa isolation passivation layer is fabricated by: placing the GaN rectifier epitaxial wafer into the plasma-assisted chemical vapor deposition device, and repeating the process in step (10) to deposit the $SiN_x$ passivation layer in the etched grooves of the GaN rectifier epitaxial wafer for 90 min.

(16) After the excessive SiNx layer on the surface of the GaN rectifier epitaxial wafer processed in step (15) is removed by using the wet etching process in step (12), the residual SiNx and photoresist on the surface of the GaN rectifier epitaxial wafer is removed by means of immersion in the degumming liquid and ultrasonic cleaning by using the process in step (6), so as to finally obtain a GaN rectifier chip, suitable for operating at an alternating current frequency of 35 GHz, on the silicon substrate.

The test result for the GaN rectifier fabricated according to this embodiment is similar to that of Embodiment 1, and the description thereof is not repeated thereto.

Embodiment 3

A method for preparing a GaN rectifier chip suitable for operating at an alternating current frequency of 35 GHz on a silicon substrate of this embodiment is as follows.

(1) By using metal organic chemical vapor deposition technique, a GaN rectifier epitaxial wafer is grown on a silicon substrate, including an N-polar GaN buffer layer grown on the silicon substrate, a carbon doped semi-insulated N-polar GaN layer grown on the N-polar GaN buffer layer with the doping concentration of $5.9\times10^{18}$ $cm^{-3}$, a non-doped N-polar AlGaN layer grown on the carbon doped semi-insulated N-polar GaN layer, a non-doped N-polar GaN layer grown on the non-doped N-polar AlGaN layer, a non-doped N-polar InGaN thin film grown on the non-doped N-polar GaN layer, wherein the GaN buffer layer is 850 nm in thickness; the carbon doped GaN layer is 200 nm in thickness; the non-doped AlGaN layer is 450 nm in thickness; the non-doped GaN layer is 650 nm in thickness; and the non-doped InGaN layer is 150 nm in thickness.

(2) The GaN rectifier epitaxial wafer is sequentially placed into acetone, anhydrous ethanol and deionized water for ultrasonic treatment for 3 min respectively, the epitaxial wafer is rinsed with deionized water, and then the cleaned GaN rectifier epitaxial wafer is dried by hot and high purity nitrogen.

(3) The cleaned GaN epitaxial wafer is spin-coated with positive photoresist, with the model of RZJ304 and the photoresist thickness of 0.2 μm; the epitaxial wafer coated with photoresist is placed into a hot stage to be pre-baked for 45 s; then, the epitaxial wafer coated with photoresist is placed into a lithography machine for lithographic exposure, with exposure time of 4 s; next, the exposed epitaxial wafer is immersed into a positive developing liquid, with the model of the developing liquid of RZX3038, the immersion time of 30 s; and finally, the epitaxial wafer after completed development is taken out and then washed with deionized water and dried with high purity nitrogen, and the epitaxial wafer is placed on the hot stage to be baked for film hardening, with the baking time of 45 s.

(4) The GaN rectifier epitaxial wafer after lithography is placed into the reactive ion etching machine to perform reactive ion etching on the patterns of the schottky contact electrode exposed by the lithography, so as to etch out grooves corresponding to the patterns, with the depth of the grooves being 400 nm.

(5) Preparation of a schottky contact electrode is performed on the GaN rectifier epitaxial wafer by: placing the GaN rectifier epitaxial wafer etched by reactive ions into an electron beam evaporation device, in which the chamber is evacuated to $5 \times 10^{-5}$ Pa, followed by successively evaporating with electrode metals $MoS_2$/Ni/Au, and after the evaporation, the GaN rectifier epitaxial wafer is annealed at the temperature of 800° C. for 120 min.

(6) The GaN rectifier epitaxial wafer that is prepared with the ohm electrodes is immersed into the degumming liquid for 100 min, the epitaxial wafer is rinsed with deionized water after taken out and then placed into acetone to be subjected to ultrasonic treatment for 15 min, and after taken out, the epitaxial wafer is rinsed with deionized water and dried with hot nitrogen.

(7) The GaN rectifier epitaxial wafer is aligned with an alignment mark in the mask, the lithography process in the step (3) is repeated to perform the lithographic development at corresponding positions so as to prepare the area of device schottky contact electrode patterns exposed on the GaN rectifier epitaxial wafer.

(8) Preparation of an ohmic contact electrode is conducted on the GaN rectifier epitaxial wafer after lithography by: placing the GaN rectifier epitaxial wafer prepared with the device's ohmic contact patterns into the electron beam evaporation device, in which the chamber is evacuated to $1 \times 10^{-5}$ Pa, followed by successively evaporating with the ohmic contact electrode materials Ti/Al/Ni/Au.

(9) The process in step (6) is repeated to remove the photoresist and evaporated metals residual on the surface of the GaN epitaxial wafer by means of immersion in the degumming liquid and ultrasonic cleaning.

(10) An $SiN_x$ (x=1.33-1.5) passivation layer is prepared using a plasma-enhanced chemical vapor deposition method by: placing the GaN rectifier epitaxial wafer that is prepared with electrodes into the plasma enhanced chemical vapor deposition device, in which the instrument is warmed up to 800° C., the chamber is evacuated to $5 \times 10^{-5}$ Pa, and the deposition time is 120 min.

(11) The process in step (3) is repeated to prepare a mask on the surface of the GaN epitaxial wafer by means of lithographic development, and to expose the $SiN_x$ on the patterns of the ohmic contact electrode and the schottky contact electrode.

(12) The exposed $SiN_x$ passivation layer is etched away by using a wet etching method; after taken out, the epitaxial wafer is rinsed with deionized water; and finally, the process in step (6) is repeated to remove the photoresist and $SiN_x$ residual on the surface of the epitaxial wafer by means of immersion in the degumming liquid and ultrasonic cleaning.

(13) Alignment is performed by means of the alignment mark in the mask, and the process in step (3) is repeated to prepare mesa isolation patterns on the surface of the GaN epitaxial wafer by means of lithographic development.

(14) The mesa isolation patterns are etched by: repeating the process in step (4) to etch the grooves on the surface of the GaN rectifier epitaxial wafer obtained in step (13) by using the reactive ion etching device, in which the etching depth is 2.5 µm; and after etching, cleaning the surface of epitaxial wafer with deionized water and drying same with hot nitrogen.

(15) A mesa isolation passivation layer is fabricated by: placing the GaN rectifier epitaxial wafer into the plasma-assisted chemical vapor deposition device, and repeating the process in step (10) to deposit the $SiN_x$ passivation layer in the etched grooves of the GaN rectifier epitaxial wafer for 120 min.

(16) After the excessive SiNx layer on the surface of the GaN rectifier epitaxial wafer processed in step (15) is removed by using the wet etching process in step (12), the residual SiNx and photoresist on the surface of the GaN rectifier epitaxial wafer is removed by means of immersion in the degumming liquid and ultrasonic cleaning by using the process in step (6), so as to finally obtain a GaN rectifier chip, suitable for operating at an alternating current frequency of 35 GHz, on the silicon substrate.

The test result for the GaN rectifier fabricated according to this embodiment is similar to that of Embodiment 1, and the description thereof is not repeated thereto.

The foregoing embodiments are preferred implementations of the present invention. However, the implementations of the present invention are not limited to the described embodiments. Any other changes, modifications, replacements, combinations, and simplifications made without departing from the spirit, essence, and principle of the present invention shall all be equivalent replacements, and all fall within the protection scope of the present invention.

The invention claimed is:

1. A method for preparing a GaN rectifier suitable for operating at an alternating current frequency of 35 GHz, comprising the following steps:
    (1) sequentially growing, on a silicon substrate, an N-polar GaN buffer layer, a carbon doped semi-insulating N-polar GaN layer, a non-doped N-polar AlGaN layer, a non-doped N-polar GaN layer and a non-doped N-polar InGaN thin film to obtain a GaN rectifier epitaxial wafer;
    (2) placing the GaN rectifier epitaxial wafer obtained in step (1) sequentially into acetone, deionized water and anhydrous ethanol for an ultrasonic treatment, and cleaning the GaN rectifier epitaxial wafer with deionized water and then drying the GaN rectifier epitaxial wafer by hot and high purity nitrogen;
    (3) performing a lithographic preparation of a schottky contact electrode pattern on the GaN rectifier epitaxial wafer obtained in step (2) by spin-coating the GaN rectifier epitaxial wafer obtained in step (2) uniformly with a photoresist, pre-baking and then exposing the GaN rectifier epitaxial wafer coated with the photoresist in a lithography machine, and finally immersing the exposed GaN rectifier epitaxial wafer in a developing liquid for a lithographic development and cleaning;
    (4) performing a reactive ion etching on the GaN rectifier epitaxial wafer after the GaN rectifier epitaxial wafer is subjected to the lithographic process in step (3), and etching grooves along the schottky contact electrode patterns in the GaN rectifier epitaxial wafer to obtain an ohmic contact electrode;

(5) placing the GaN rectifier epitaxial wafer having the etched grooves corresponding to patterns of the ohmic contact electrode obtained in step (4) into an evaporation chamber including an electron beam evaporation device and evacuating the evaporation chamber, followed by successively evaporating schottky contact electrode metals, and after the evaporation, annealing the GaN rectifier epitaxial wafer;

(6) removing the photoresist by immersing the GaN rectifier epitaxial wafer into a degumming liquid, rinsing the GaN rectifier epitaxial wafer with deionized water and performing an ultrasonic treatment by using acetone to remove residual photoresist and evaporated metals on a surface of the GaN rectifier epitaxial wafer, and after the ultrasonic treatment, cleaning the GaN rectifier epitaxial wafer with the deionized water and drying the GaN rectifier epitaxial wafer with hot and high purity nitrogen;

(7) aligning the GaN rectifier epitaxial wafer with an alignment mark in a mask, repeating the process in step (3) to perform a lithographic development at corresponding positions, and preparing device ohmic contact electrode patterns and cleaning the GaN rectifier epitaxial wafer;

(8) conducting an ohmic contact electrode preparation on the GaN rectifier epitaxial wafer by placing the GaN rectifier epitaxial wafer with the developed ohmic contact electrode patterns obtained in step (7) into the electron beam evaporation device and evacuating the evaporation chamber, followed by successively evaporating the ohmic contact electrode metals, and after the evaporation, annealing the GaN rectifier epitaxial wafer;

(9) repeating the process in step (6) to remove residual photoresist and evaporated metal on the surface of the GaN epitaxial wafer by means of immersion in the degumming liquid and an ultrasonic cleaning;

(10) preparing a silicon nitride passivation layer using a plasma enhanced chemical vapor deposition method by placing the GaN rectifier epitaxial wafer obtained in step (9) into a plasma enhanced chemical vapor deposition device, warming up the GaN rectifier epitaxial wafer and evacuating to a high vacuum, and then introducing a carrier gas and a reactive gas into the plasma enhanced chemical vapor deposition device, and then depositing an $SiN_x$ passivation layer on the surface of the GaN rectifier epitaxial wafer, where x=1.33-1.5;

(11) repeating the process in step (3), preparing a mask on the surface of the GaN epitaxial wafer by means of a lithographic development, and exposing the SiNx passivation layer on the patterns of the ohmic contact electrode and the schottky contact electrode;

(12) etching away the exposed SiNx passivation layer by using a wet etching method, and repeating the process in step (6) to remove residual photoresist on the surface of the GaN rectifier epitaxial wafer and the silicon nitride passivation layer and clean the GaN rectifier epitaxial wafer by means of immersion in the degumming liquid and an ultrasonic cleaning;

(13) performing alignment by means of the alignment mark in the mask, and repeating the process in step (3) to prepare mesa isolation patterns on the surface of the GaN rectifier epitaxial wafer by means of a lithographic development;

(14) performing a mesa isolation process by repeating the process in step (4) to etch grooves on the surface of the GaN rectifier epitaxial wafer obtained in step (13) by using a reactive ion etching device and cleaning up the epitaxial wafer;

(15) fabricating a mesa isolation passivation layer by placing the GaN rectifier epitaxial wafer obtained in step (14) into a plasma-assisted chemical vapor deposition device, and repeating the process in step (10) to deposit an $SiN_x$ passivation layer inside the etched grooves of the GaN rectifier epitaxial wafer; and

(16) after removing an excessive SiNx layer on the surface of the GaN rectifier epitaxial wafer processed in step (15) by using the wet etching process in step (12), removing the residual SiNx and photoresist on the surface of the GaN rectifier epitaxial wafer by means of immersion in the degumming liquid and an ultrasonic cleaning by using the process in step (6), so as to finally obtain a GaN rectifier chip, suitable for operating at an alternating current frequency of 35 GHz, on the silicon substrate.

2. The method for preparing a GaN rectifier suitable for operating at an alternating current frequency of 35 GHz according to claim 1, wherein the silicon substrate in step (1) has a (111) close-packed plane as an epitaxial plane; and
all of the N-polar GaN buffer layer, the carbon doped semi-insulated N-polar GaN layer, the non-doped N-polar AlGaN layer, the non-doped N-polar GaN layer and the non-doped N-polar InGaN thin film take (0001) as an epitaxial direction.

3. The method for preparing a GaN rectifier suitable for operating at an alternating current frequency of 35 GHz according to claim 1, wherein the durations for the ultrasonic treatment in steps (2) and (6) are both 3-15 minutes.

4. The method for preparing a GaN rectifier suitable for operating at an alternating current frequency of 35 GHz according to claim 1, wherein the photoresist in step (3) is 0.2-0.7 μm in thickness; the time for exposure is 1-4 seconds; and the time for development is 45-95 seconds.

5. The method for preparing a GaN rectifier suitable for operating at an alternating current frequency of 35 GHz according to claim 1, wherein the grooves in step (4) are 150-400 nm in depth.

6. The method for preparing a GaN rectifier suitable for operating at an alternating current frequency of 35 GHz according to claim 1, wherein vacuum degrees of the vacuum in steps (5) and (8) are both $1\text{-}5\times10^{-5}$ Pa; the temperatures for annealing in steps (5) and (8) are both 450-800° C.; and the durations for annealing are both 30-120 minutes.

7. The method for preparing a GaN rectifier suitable for operating at an alternating current frequency of 35 GHz according to claim 1, wherein the duration for the immersion in step (6) is 45-100 minutes.

8. The method for preparing a GaN rectifier suitable for operating at an alternating current frequency of 35 GHz according to claim 1, wherein the times for deposition of the $SiN_x$ passivation layer in steps (10) and (15) are both 60-120 minutes.

9. The method for preparing a GaN rectifier suitable for operating at an alternating current frequency of 35 GHz according to claim 1, wherein the grooves in step (14) are 1-2.5 μm in depth.

10. A GaN rectifier suitable for operating at an alternating current frequency of 35 GHz obtained by the method for preparing a GaN rectifier suitable for operating at an alternating current frequency of 35 GHz according to claim 1.

* * * * *